US009012783B2

(12) United States Patent
Abe et al.

(10) Patent No.: US 9,012,783 B2
(45) Date of Patent: Apr. 21, 2015

(54) HEAT DISSIPATION BASE AND ELECTRONIC DEVICE

(75) Inventors: Yuuichi Abe, Kirishima (JP); Kiyotaka Nakamura, Kirishima (JP); Kiyoshi Yakubo, Kirishima (JP)

(73) Assignee: Kyocera Corporation, Kyoto (JP)

( * ) Notice: Subject to any disclaimer, the term of this patent is extended or adjusted under 35 U.S.C. 154(b) by 263 days.

(21) Appl. No.: 13/322,111

(22) PCT Filed: May 27, 2010

(86) PCT No.: PCT/JP2010/059000
§ 371 (c)(1),
(2), (4) Date: Dec. 16, 2011

(87) PCT Pub. No.: WO2010/137651
PCT Pub. Date: Dec. 2, 2010

(65) Prior Publication Data
US 2012/0080216 A1 Apr. 5, 2012

(30) Foreign Application Priority Data
May 27, 2009 (JP) .................................. 2009-127292

(51) Int. Cl.
*H05K 1/00* (2006.01)
*H01L 23/373* (2006.01)
*B23K 35/30* (2006.01)
(Continued)

(52) U.S. Cl.
CPC ........ *H01L 23/3735* (2013.01); *B23K 35/3006* (2013.01); *B23K 35/302* (2013.01); *B23K 2201/14* (2013.01); *C22C 5/08* (2013.01); *C22C 9/00* (2013.01); *C22C 30/02* (2013.01); *H01L 2924/0002* (2013.01)

(58) Field of Classification Search
USPC ................. 174/252, 250–251, 253–257, 259
See application file for complete search history.

(56) References Cited

U.S. PATENT DOCUMENTS 4,749,594 A * 6/1988 Malikowski et al. ......... 427/190
2007/0274060 A1* 11/2007 Kiuchi et al. ................. 361/820
(Continued)

FOREIGN PATENT DOCUMENTS

CN 1657225 A 8/2005
CN 101332545 A 12/2008
(Continued)

OTHER PUBLICATIONS

Tanaka (Machine Translation of JP H11-343179, Pub. date: Dec. 14, 1999, Inventor: Tanaka Atsushi).*
(Continued)

*Primary Examiner* — Tremesha S Willis
(74) *Attorney, Agent, or Firm* — Volpe and Koenig, P.C.

(57) ABSTRACT

A brazing material includes silver and copper as main components; at least one element A selected from indium, zinc, and tin; at least one element B selected from titanium, zirconium, hafnium, and niobium; and at least one element C selected from molybdenum, osmium, rhenium, and tungsten. The content of copper is not less than 35% by mass and not more than 50% by mass, based on the total amount of silver, copper, and the elements A, B and C. A heat dissipation base includes a supporting substrate, circuit members on a first main surface of the substrate, and a heat dissipation member on a second main surface opposite to the first main surface. The circuit members are joined to the supporting substrate by a joining layer composed of the brazing material.

7 Claims, 4 Drawing Sheets

(51) Int. Cl.
*C22C 5/08* (2006.01)
*C22C 9/00* (2006.01)
*C22C 30/02* (2006.01)

(56) References Cited

U.S. PATENT DOCUMENTS

2009/0283307 A1* 11/2009 Gotoh et al. .................. 174/258
2009/0283574 A1* 11/2009 Okazaki et al. ............... 228/203

FOREIGN PATENT DOCUMENTS

| EP | 0465861 | A1 | 1/1992 |
|---|---|---|---|
| JP | 51-065056 | | 6/1976 |
| JP | 59-128279 | | 7/1984 |
| JP | 63-093496 | | 4/1988 |
| JP | 04231193 | A | 8/1992 |
| JP | 09-283656 | | 10/1997 |
| JP | 11343179 | A | 12/1999 |
| JP | 2005-112677 | | 4/2005 |

OTHER PUBLICATIONS

Chinese language office action dated Aug. 19, 2013, its English language translation and Concise Explanation issued in corresponding Chinese application 201080022985.8.

Chinese language office action dated Apr. 8, 2014, its English language translation and Concise Explanation issued in corresponding Chinese application 201080022985.8.

* cited by examiner

HEAT DISSIPATION BASE AND ELECTRONIC DEVICE

CROSS-REFERENCE TO THE RELATED APPLICATIONS

This application is a national stage of international application No. PCT/JP2010/059000, filed on May 27, 2010, and claims the benefit of priority under 35 USC 119 to Japanese Patent Application No. 2009-127292, filed on May 27, 2009, the entire contents of which are incorporated herein by reference.

TECHNICAL FIELD

The present invention relates to a brazing material used for joining circuit members to a heat dissipation member, or for some other. The invention also relates to a heat dissipation base wherein circuit members, and a heat dissipation member are each joined to a ceramic substrate through a joining layer made of this brazing material, and an electronic device wherein an electronic member is mounted over the circuit members of this heat dissipation base.

BACKGROUND ART

In recent years, electronic devices have been used in each of which an electronic component that may be of various types is mounted on a circuit member of a heat dissipation base, examples of the component including semiconductor elements such as an insulating gate bipolar transistor (IGBT) element, a metal oxide semiconductor field effect transistor (MOSFET) element, a light emitting diode (LED) element, a freewheeling diode (FWD) element and a giant transistor (GTR) element, a sublimation-type thermal printer head element, and a thermal ink-jet printer head element.

As the heat dissipation base, on which a circuit member on which an electronic component is to be mounted is set up, there is used a heat dissipation base wherein a copper plate is joined, as a circuit member, to one of the main surfaces of a ceramic substrate and further a copper plate is joined, as a heat dissipation member good in heat dissipating property, to the other main surface. For joining the ceramic substrate to the circuit member and the heat dissipation member, a brazing material is used.

For this reason, the brazing material, which is used to join the circuit member and the heat dissipation member to the ceramic substrate, is required to have a high joining strength. The heat dissipation base, wherein the circuit member and the heat dissipation member are joined to the ceramic substrate through a joining layer made of the brazing material, is required to have an excellent heat dissipation property, and a high reliability that permits the base to be used for a long term.

As such a heat dissipation base, for example, Patent Literature 1 suggests a ceramic circuit board wherein metal circuit plates are joined to a ceramic substrate through a silver-copper based brazing material layer containing carbon powder and at least one active metal selected from Ti, Zr, Hf and Nb. Additionally, it is stated that when at least one element selected from In, Zn, Cd and Sn is further incorporated into the silver-copper based brazing material layer, the melting point of the brazing material is made low to lower the temperature for joining the metal circuit plates.

PRIOR ART LITERATURE

Patent Literature

[Patent Literature 1] Japanese Unexamined Patent Publication No. 9-283656

SUMMARY OF THE INVENTION

Problems to be Solved by the Invention

However, the ceramic circuit board suggested by Patent Literature 1 contains, in the silver-copper based brazing material layer thereof, carbon powder and the active metal(s). This matter makes the linear expansion coefficient of the silver-copper based brazing material layer close to that of the ceramic substrate. Thus, after the joining of the metal circuit plates, stress remaining therein is decreased, so that the board becomes excellent in thermal cycle resistance and high in reliability. However, when the interval between plural metal circuit plates arranged on a ceramic substrate has been made narrow by a rise in the integration degree of circuits in recent years, there has been caused a problem that the silver-copper based brazing material for joining each of the metal circuit plates to the ceramic substrate protrudes from the joint region to bring some of the metal circuits into contact with each other so that a short circuit is caused.

In order to solve the above problems, the invention has been created, and an object thereof is to provide a brazing material capable of being restrained from protruding unnecessarily from joint regions. Another object thereof is to provide a heat dissipation base which scarcely has a risk that a short circuit is caused between any adjacent two of its circuit members to cope with a rise in the integration degree of the circuit members; and an electronic device using this base.

Means for Solving the Problems

The brazing material of the invention comprises silver and copper as main components; at least one element A selected from indium, zinc and tin; at least one element B selected from titanium, zirconium, hafnium and niobium; and at least one element C selected from molybdenum, osmium, rhenium and tungsten.

The heat dissipation base of the invention comprises a supporting substrate with an insulation properties; a plurality of circuit members containing copper and formed on a first main surface of the supporting substrate, and a heat dissipation member formed on a second main surface of the supporting substrate, the second main surface being opposite to the first main surface, wherein the plurality of the circuit members are arranged on the first main surface, and each of the plurality of circuit members is joined to the supporting substrate through a joining layer composed of the a brazing material having any one of the above-mentioned structures.

The electronic device of the invention comprises the heat dissipation base having any one of the above-mentioned structures, and an electronic component mounted on the circuit members of the heat dissipation base.

Effect of the Invention

The brazing material of the invention comprises silver and copper as main components, and comprises at least one element A selected from indium, zinc, and tin, at least one element B selected from titanium, zirconium, hafnium, and niobium, and at least one element C selected from molybdenum, osmium and tungsten. Thus, the brazing material has good wettability to a supporting substrate, circuit members, and a heat dissipation member. Nonmetallic components constituting the supporting substrate react with the element B, thereby making it possible to heighten the joining strength between the supporting substrate and the circuit members as well as the heat dissipation member. Furthermore, the brazing material contains the element A, which is low in melting point, thereby reducing gaps between individual joining layers made of the brazing material, and the supporting substrate, the circuit members or the heat dissipation member while the brazing material contains the element C, which is high in melting point, thereby restraining the viscosity of the brazing material from becoming too high so that the material can be restrained from protruding unnecessarily from the joint regions.

The heat dissipation base of the invention comprises an insulating supporting substrate, circuit members containing copper and formed on a first main surface of the substrate, and a heat dissipation member formed on a second main surface of the substrate, which is opposite to the first main surface, wherein the circuit members are arranged on the first main surface, and are each joined to the supporting substrate through a joining layer comprising the brazing material of the invention, whereby the brazing material is restrained from protruding unnecessarily from the joint regions. Thus, a fear that a short circuit is caused between adjacent two of the circuit members is decreased. Moreover, gaps generated between the supporting substrate and the circuit members are small, so that this heat dissipation base can be high in joining strength.

According to the electronic device of the invention, at the time of mounting an electronic component on the circuit members in the heat dissipation base of the invention, a short circuit is hardly caused between any adjacent two of the circuit members; thus, high reliability can be rendered to the device.

BRIEF DESCRIPTION OF THE DRAWINGS

FIG. 1(a), FIG. 1(b) and FIG. 1(c) are a plan view, a sectional view taken on line A-A' in FIG. 1(a), and a bottom surface view, respectively.

FIG. 2(a), FIG. 2(b) and FIG. 2(c) are a plan view, a sectional view taken on line B-B' in FIG. 2(a), and a bottom surface view, respectively.

FIG. 3(a), FIG. 3(b) and FIG. 3(c) are a plan view, a sectional view taken on line C-C' in FIG. 3(a), and a bottom surface view, respectively.

FIG. 4(a), FIG. 4(b) and FIG. 4(c) are a plan view, a sectional view taken on line D-D' in FIG. 4(a), and a bottom surface view, respectively.

EMBODIMENTS FOR CARRYING OUT THE INVENTION

Hereinafter, embodiments of the brazing material of the invention, and a heat dissipation base and an electronic device each using this material are explained.

Figure 1:
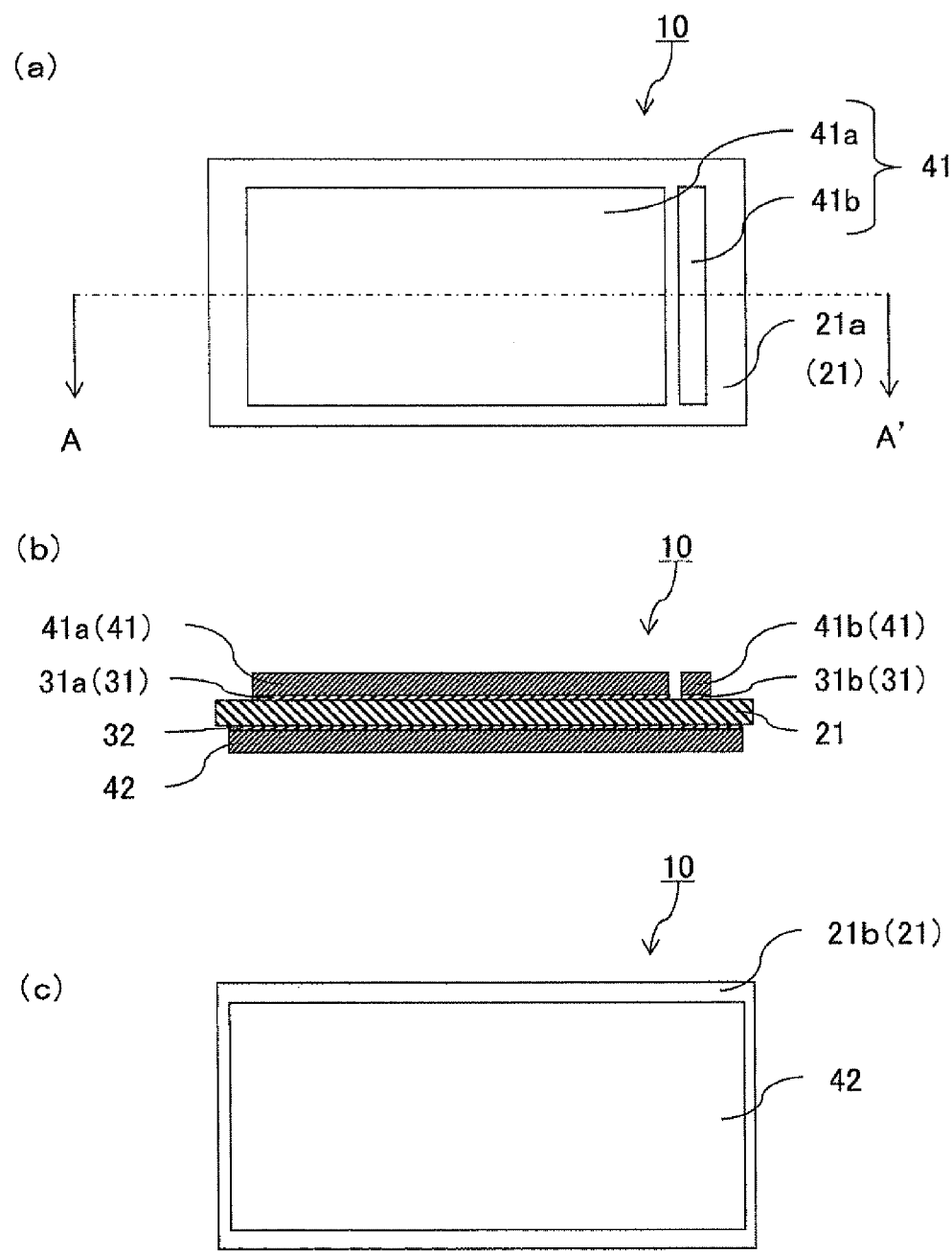
FIG. 1 illustrates an embodiment of the heat dissipation base of the invention.

FIG. 1 illustrate one of the embodiments of the heat dissipation base of the invention, and FIG. 1(a), FIG. 1(b) and FIG. 1(c) are a plan view thereof, a sectional view taken on line A-A' in FIG. 1(a), and a bottom surface view thereof, respectively.

The heat dissipation base illustrated in FIGS. 1(a) to 1(c) is a heat dissipation base 10 wherein circuit members 41 (41a and 41b) containing copper are formed on a first main surface 21a of an insulating supporting substrate 21, and a heat dissipation member 42 is formed on a second main surface 21b thereof. The circuit members 41 and the heat dissipation member 42 each formed on the heat dissipation base 10 are joined to the supporting substrate 21 through joining layers 31a and 31b made of a brazing material, respectively.

It is important that the brazing material used in this joint contains silver and copper as main components, and contains at least one element A selected from indium, zinc, and tin, at least one element 13 selected from titanium, zirconium, hafnium, and niobium, and at least one element C selected from molybdenum, osmium, rhenium, and tungsten.

The main components in the brazing material that is to be the joining layers 31a, 31b and 32 are silver and copper, and totally occupy 50% by mass or more of all components (100% by mass) that constitute the brazing material.

The element A contained in the brazing material comprises at least one selected from indium, zinc, and tin. The element A is low in melting point to be easily melted; thus, the brazing material is good in fluidity to make it possible to reduce gaps (remaining gaps resulting from a matter that the brazing material cannot follow) between the individual joining layers 31, 31b and 32 made of the brazing material, and the supporting substrate 21, the circuit members 41 or the heat dissipation member 42. As to the gaps, it is checked by an ultrasonic flaw-detecting method whether or not the gaps are present.

The element B contained in the brazing material comprises at least one selected from titanium, zirconium, hafnium and niobium. The brazing material containing the element B is good in wettability to the supporting substrate 21, the circuit members 41 and the heat dissipation member 42. The element B reacts with nonmetallic components constituting the supporting substrate 21, thereby heightening the joining strength between the supporting substrate 21 and the heat dissipation member 42 as well as the circuit members 41. This joining strength can be checked by measuring the peel strength according to JIS C 6481-1996.

The element C contained in the brazing material comprises at least one selected from molybdenum, osmium, rhenium, and tungsten. The element C is high in melting point not to be easily melted. Thus, the element C can restrain the brazing material from becoming too high in viscosity to restrain the brazing material from protruding unnecessarily from the joint regions. In the present embodiment, the wording "unnecessary protrusion from the joint regions" means that the material protrudes into a region where the joining layer 31a or 31b extending outward from each side of the circuit member 41a or 41b protrudes by above 0.2 mm on a line through which the side of the circuit member 41a or 41b is perpendicularly joined to the side of the supporting substrate 21. The length that the joining layer 31a or 31b protrudes on the line can be checked with an optical microscope.

This brazing material contains silver and copper as the main components, and contains the elements A, B and C, which have the above-mentioned features, thereby exhibiting a good wettability to the supporting substrate 21, the circuit members 41 and the heat dissipation member 42, and further the element B reacts with the nonmetallic components constituting the supporting substrate 21, thereby making it possible to heighten the joining strength between the supporting substrate 21 and the heat dissipation member 42 as well as the circuit members 41. Furthermore, the brazing material contains the element A, which is low in melting point, thereby making it possible to reduce the gaps made between the individual joining layers 31a and 31b, and 32, and the supporting substrate 21, the circuit members 41 or the temperature distribution 42. Additionally, the brazing material contains the element C, which is high in melting point to restrain the brazing material from becoming too high in viscosity, thereby making it possible to restrain the brazing material from protruding unnecessarily from the joint regions.

The preferable contents of the elements A, B and C, which can give the above-mentioned features, are as follows: the content of the element A is not less than 2% by mass and not more than 22% by mass; that of the element B is not less than 1 by mass and not more than 8% by mass; and that of the element C is not less than 1% by mass and not more than 8% by mass of all the components (100% by mass) forming the brazing material. The balance is silver and copper as the main components.

The content of copper in the brazing material is preferably 35 to 50% by mass. When the copper content is in the range, the fluidity of the brazing material can be made good and further the supporting substrate 21 can be satisfactorily joined to the heat dissipation member 42 as well as the circuit members 41 in the state that the gaps therebetween are small at a lower temperature than when silver, as well as copper, is singly used. It is advisable that the identification and the content of each of the elements constituting the brazing material can attain with fluorescent X-ray analysis or ICP (inductively coupled plasma) atomic emission spectrometry.

The content of oxygen in the brazing material is preferably 2% by mass or less. When the oxygen content is in the range, the individual elements constituting the brazing material can be restrained from being oxidized to make it possible to reduce a risk that the joining strength is decreased between the supporting substrate 21 and the heat dissipation member 42 as well as the circuit members 41. It is advisable that the content of oxygen contained in the brazing material can determine with infrared absorbing analysis.

The heat dissipation base 10 of the example illustrated in FIGS. 1(a) to 1(c) is a heat dissipation base 10 including the insulating supporting substrate 21, the copper-containing circuit members 41a and 41b set over the first main surface 21a of the substrate 21, and the heat dissipation member 42 set over the second main surface 21b of the substrate 21, the second main surface 21b being opposite to the first main surface 21a. In the heat dissipation base 10, the circuit members 41a and 41b are arranged over the first main surface 21a of the supporting substrate 21, and are each joined to the supporting substrate 21 through the joining layer 31a or 31b made of or containing the brazing material of the invention that has any one of the above-mentioned structures.

In this heat dissipation base 10, the circuit members 41a and 41b are each joined to the supporting substrate 21 through the joining layer 31a or 31b made of the brazing material of the invention, thereby restraining the brazing material from protruding unnecessarily from the joint regions to reduce a risk that a short circuit is caused between the circuit members 41a and 41b adjacent to each other. As a result, the heat dissipation base 10 can be rendered capable of coping with a rise in the integration degree of circuits. Moreover, the gaps generated between the supporting substrate 21 and the circuit members 41a and 41b are small so that the substrate and the members have a high joining strength therebetween; thus, the heat dissipation base 10 can be rendered high in reliability.

The supporting substrate 21, which constitutes the heat dissipation base 10, has a size permitting the circuit members 41a and 41b, and the heat dissipation member 42 to be joined to this substrate 21. The thickness thereof, which is varied with the usage, is preferably 0.13 mm to 0.64 mm in order to permit the substrate to be made low in thermal resistance and to keep endurance.

It is preferred that the first main surface 21a and the second main surface 21b of the supporting substrate 21 have no pinhole-form defects of 0.15 mm or more diameter. When the surfaces have no pinhole-form defects of 0.15 mm or more diameter, moisture is not easily adsorbed on the first and second main surfaces 21a and 21b of the supporting substrate 21. Thus, the heat dissipation base 10 can be used in an environment high in humidity.

About the circuit members 41a and 42, which constitute the heat dissipation base 10, the shape thereof is decided in accordance with the shape of electronic members (not illustrated) to be mounted on the circuit members 41a and 41b in the heat dissipation base 10, or some other factor, and is required to cope with the quantity of heat generated from the electronic members, the value of current flowing in the circuit members 41a and 41b, and others. The thickness coping with this requirement is, for example, 0.2 mm to 0.6 mm.

The heat dissipation member 42, which constitutes the heat dissipation base 10, has a function of releasing the heat from the electronic components which have generated heat. When the thickness of the supporting substrate 21 is 0.13 mm to 0.64 mm and the thickness of the circuit members 41a and 41b is 0.2 mm to 0.6 mm, the thickness of the heat dissipation member 42 is, for example, 0.2 mm to 0.6 mm. The thickness of the joining layers 31a, 31b and 32 is, for example, 10 μm to 20 μm.

Figure 2:
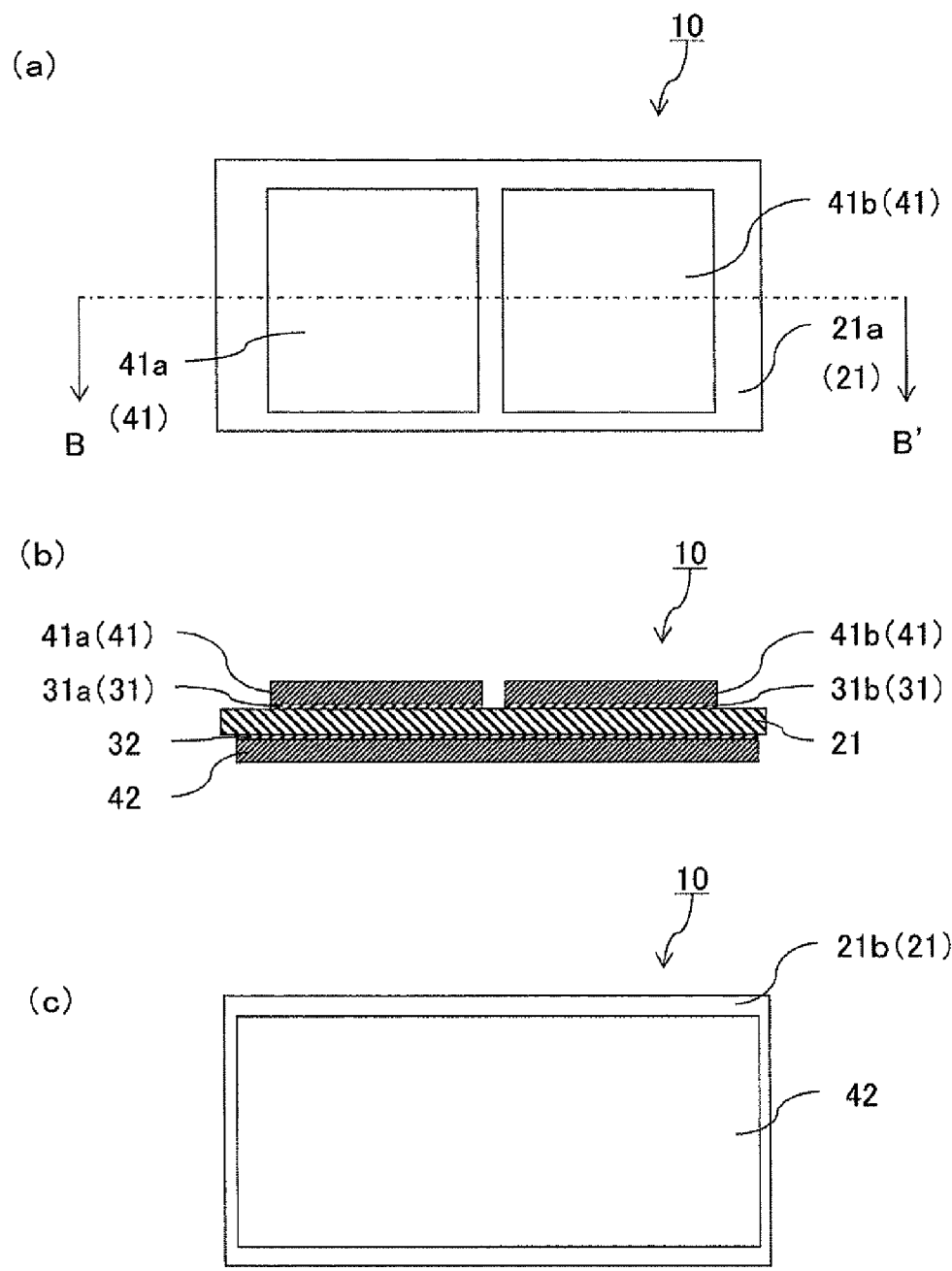
FIG. 2 illustrates another embodiment of the heat dissipation base of the invention.
Figure 3:
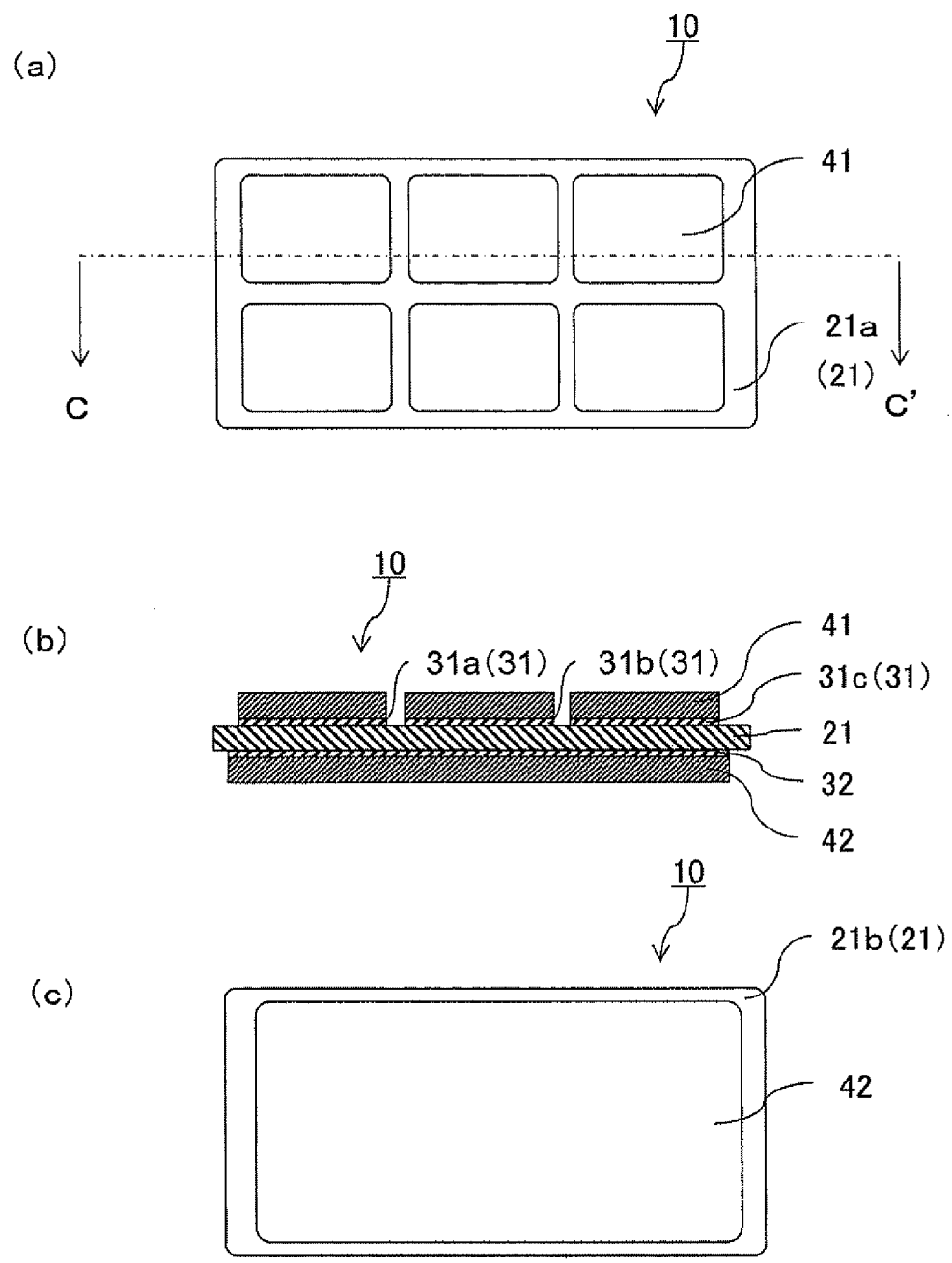
FIG. 3 illustrates still another embodiment of the heat dissipation base of the invention.
Figure 4:
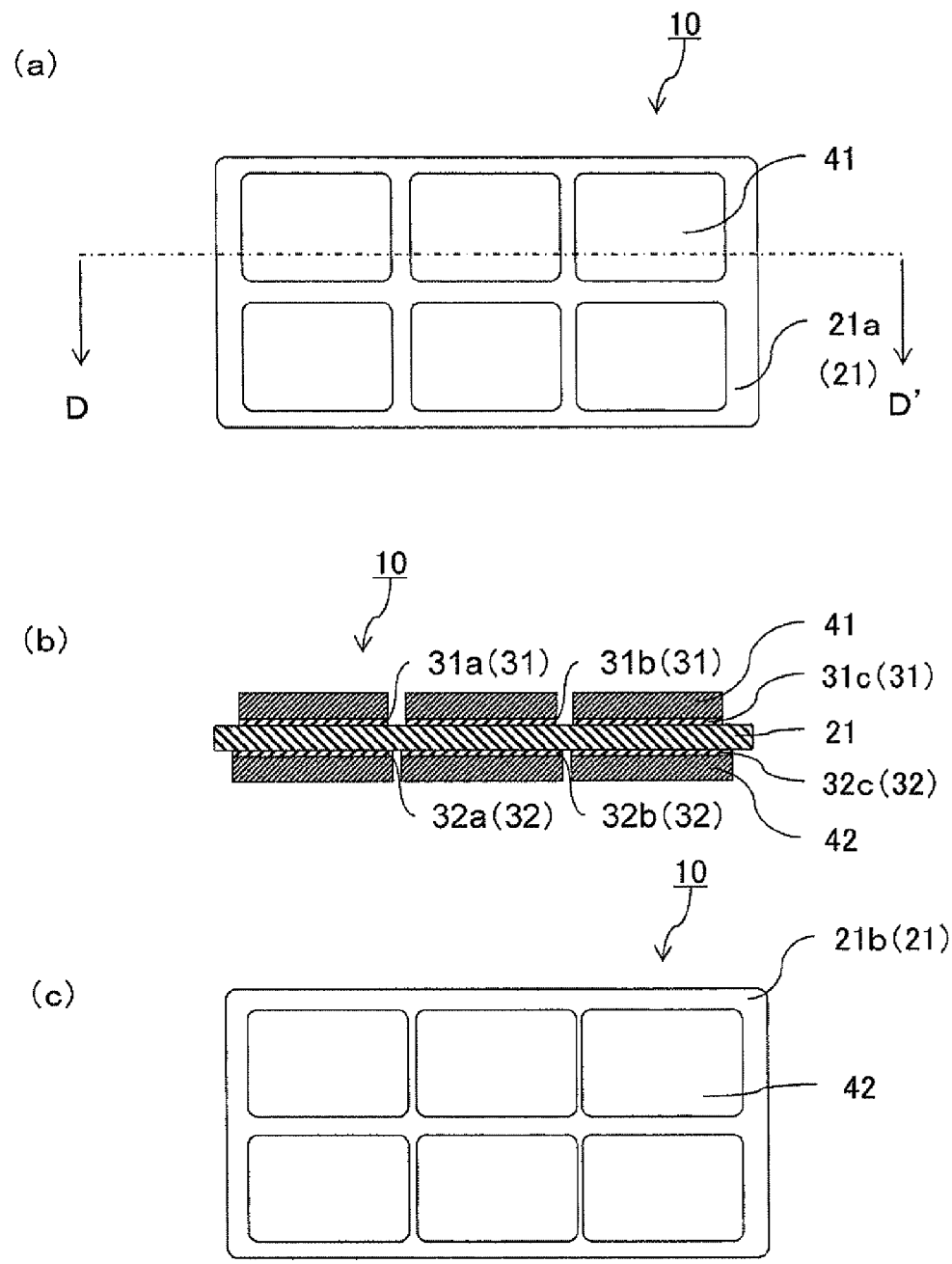
FIG. 4 illustrates a further embodiment of the heat dissipation base of the invention.

FIGS. 2(a) to 2(c), FIGS. 3(a) to 3(c) and FIGS. 4(a) to 4(c) illustrate others of the embodiment examples of the heat dissipation base of the invention, respectively. FIGS. 2(a), 3(a) and 4(a) are respective plan views thereof. FIGS. 2(b), 3(b) and 4(b) are sectional views taken on a line B-B' in FIG. 2(a), a line C-C' in FIG. 3(a), and a line D-D' in FIG. 4(a), respectively, and FIGS. 2(c), 3(c) and 4(c) are respective bottom surface views thereof. In FIGS. 2(a) to 4(c), the same members as in FIGS. 1(a) to 1(c) are each represented by the same reference number as therein.

In a heat dissipation base 10 in the example illustrated in FIGS. 2(a) to 2(c), circuit members 41a and 41b arranged in a first main surface 21a of a supporting substrate 21 are equivalent to each other in size when viewed in plan view. The structure of a heat dissipation member 42 set on a second main surface 21b thereof is equivalent to that of the heat dissipation base 10 in the example illustrated in FIGS. 1(a) to 1(c). In the heat dissipation base wherein the circuit members 41a and 41b equivalent to each other in size are arranged on the first main surface 21a of the supporting substrate 21 as seen in the example illustrated in FIGS. 2(a) to 2(c), a warp in the supporting substrate 21 that is generated in the process for producing the heat dissipation base 10 can be further restrained than in the heat dissipation base 10 in the example illustrated in FIGS. 1(a) to 1(c).

In a heat dissipation base 10 in the example illustrated in FIGS. 3(a) to 3(c), circuit members 41 are arranged in plural rows and plural columns on a first main surface 21a of a supporting substrate 21, and a heat dissipation member 42 set on a second main surface 21b thereof is equivalent to that in the heat dissipation base 10 in the example illustrated in FIGS. 1(a) to 1(c). In the heat dissipation base wherein the circuit members 41, which are equivalent to each other in size, are arranged in the rows and the columns on the first main surface 21a of the supporting substrate 21 as seen in the example illustrated in FIGS. 3(a) to 3(c), a warp in the supporting substrate 21 that is generated in the process for producing the heat dissipation base 10 can be further restrained than in the heat dissipation base 10 in the example illustrated in FIGS. 1(a) to 1(c).

In a heat dissipation base 10 in the example illustrated in FIGS. 4(a) to 4(c), circuit members 41 are arranged in plural rows and plural columns on a first main surface 21a of a supporting substrate 21, and heat dissipation members 42 are arranged in plural rows and plural columns on a second main surface 21b thereof. When the circuit members 41 and the heat dissipation members 42, which have the same size, are arranged in the plural-row-and-plural-column-forms on the first main surface 21a and the second main surface 21b, respectively, as seen in the example illustrated in FIGS. 4(a) to 4(c), a warp in the supporting substrate 21 that is generated in the process for producing the heat dissipation base 10 can be restrained. Furthermore, the circuit members 41 and the heat dissipation members 42, which are arranged above and below the supporting substrate 21, are good in symmetry through the supporting substrate 21 as a boundary. Even when a difference is caused in generated heat between electronic components mounted on the individual circuit members 41, the heats from the components can be dissipated from the respective heat dissipation members 42. Thus, the heat dissipation members 42 are less easily peeped in this base 10 than in the heat dissipation base 10 in the example illustrated in FIGS. 3(a) to 3(c). As a result, this heat dissipation base 10 can be made higher in reliability.

The average crystal grain diameter of the element C in the joining layers 31 (31a, 31b and 31c) and 32 (32a, 32b and 32c) is preferably 3 μm to 10 μm. When the average crystal grain diameter of the element C in the joining layers 31 and 32 is from 3 to 10 μm inclusive, the brazing material is further restrained from protruding unnecessarily from the joint regions to result in a further reduction of a risk that a short circuit is caused between the adjacent circuit members 41. Moreover, the gaps generated between the supporting substrate 21 and the circuit members 41 are sufficiently restrained so that a higher joining strength can be obtained therebetween. It is advisable to determine the average crystal grain diameter of the element C in the joining layers 31 and 32 as follows: the joining layers 31 and 32 are immersed for one minute in a solution of 40° C. temperature wherein hydrogen peroxide water and diluted sulfuric acid are mixed with each other at a 50% by mass to etch the layers; the element C is identified by electron probe micro analysis; and then the average crystal grain diameter of the element C is measured according to a cutting method described in JIS H 0501-1986 (ISO 2624-1973).

The supporting substrate 21 is made of a ceramic material made of silicon nitride or aluminum nitride as a main ingredient. This ceramic material may be a sintered body or a monocrystal.

The main ingredient referred to herein means an ingredient that occupies 50% or more by mass of all components (100% by mass) constituting the ceramic material. It is advisable to identify the main ingredient by the X-ray diffraction method, and measure the content of the main ingredient by fluorescent X-ray analysis or ICP atomic emission spectrometry. Specifically, when the main ingredient of the supporting substrate 21 is silicon nitride, the proportion of silicon nitride may be obtained by measuring the proportion of silicon by fluorescent X-ray analysis or ICP atomic emission spectrometry, and then converting the measured value into a value in terms of the nitride. When the main ingredient of the supporting substrate 21 is aluminum nitride, the proportion of aluminum nitride may be obtained by measuring the proportion of aluminum in the same manner as described above, and then converting the measured value into a value in terms of the nitride.

When the supporting substrate 21 is made of a ceramic material containing aluminum nitride as a main ingredient, this heat dissipating property of the heat dissipation base 10 can be made high since the material has a thermal conductivity of 150 W/(m*K) or more.

When the supporting substrate 21 is made of a ceramic material containing silicon nitride as a main ingredient, the supporting substrate 21 is preferred since the material has a thermal conductivity of 40 W/(m*K) or more and is further excellent in mechanical properties. When the supporting substrate 21 is made of a ceramic material containing silicon nitride as a main ingredient, the supporting substrate 21 can be rendered a substrate having the following mechanical properties: a three-point bending strength of 500 MPa or more; a dynamic elasticity modulus of 300 GPa or more; a Vickers hardness (Hv) of 13 GPa or more; and a fracture toughness ($K_{1c}$) of 5 MPam$^{1/2}$ or more. When the supporting substrate 21 have these mechanical properties, the heat dissipation base 10 formed by use thereof is improved, in particular, in creep resistance and heat-cycle resistance to be excellent in reliability. Thus, the heat dissipation base 10 can be used over a long term.

It is advisable to determine the three-point bending strength by etching the heat dissipation base 10 to detach, from the supporting substrate 21, the circuit members 41 and the heat dissipation member(s) 42 joined thereto through the joining layers 31 and 32, and using the resultant supporting substrate 21 to make a measurement according to JIS R 1601-2008 (ISO 14704:2000 (MOD)). When the supporting substrate 21 is thin so that the thickness of the test piece cut out from the supporting substrate 21 cannot be set to 3 mm, the thickness of the supporting substrate 21 is regarded, as it is, as that of the test piece to evaluate the substrate. The result is expected to satisfy the above-mentioned values.

It is also advisable to determine the dynamic elasticity modulus by etching the heat dissipation base 10 to detach the circuit members 41 and the heat dissipation member(s) 42, and using the resultant supporting substrate 21 to make a measurement according to an ultrasonic pulse method prescribed in JIS R 1602-1995. When the supporting substrate 21 is thin so that the thickness of the test piece cut out from the supporting substrate 21 cannot be set to 4 mm, the thickness of the supporting substrate 21 is regarded, as it is, as that of the test piece to evaluate the substrate. The result is expected to satisfy the above-mentioned values.

It is advisable to determine the Vickers hardness (Hv) and the fracture toughness ($K_{1c}$) according to JIS R 1610-2003 (ISO 14705:2000 (MOD)), and an indentation fracture method (IF method) prescribed in JIS R 1607-1995, respectively. When the supporting substrate 21 is thin so that the thickness of the test piece cut out from the supporting substrate 21 cannot be set to 0.5 mm, which is specified in JIS R 1610-2003 (ISO 14705:2000 (MOD)), and 3 mm, which is specified in the indentation fracture method (IF method) in JIS R 1607-1995, respectively, the thickness of the supporting substrate 21 is regarded, as it is, as that of the test piece to evaluate the substrate. It is preferred that the results satisfy the above-mentioned values. However, when the supporting substrate 21 is too thin to use the thickness thereof, as it is, to evaluate the substrate to cause the evaluation-result to satisfy the above-mentioned values, it is advisable to change the load for the press-fitting in accordance with the thickness of the supporting substrate 21, and make simulations on the basis of the results obtained by the change to esteem the Vickers hardness (Hv) generated when the thickness is 0.5 mm and the fracture toughness ($K_{1c}$) generated when the thickness is 3 min.

In order to obtain the above-mentioned mechanical properties, the supporting substrate preferably contains at least 80% or more by mass of silicon nitride as a main ingredient, and may contain, as other components, erbium oxide, magnesium oxide, silicon nitride, molybdenum oxide, aluminum oxide, and others.

About the electrical property of the supporting substrate 21, it is preferred that the volume resistivity is $10^{12}$ $\Omega$*m or more at normal temperature and is $10^{10}$ $\Omega$*m or more at 300° C. When the supporting substrate 21 has this electrical property, the following can be attained at the time of the operation of electronic components mounted on the circuit members 41 set on the first main surface 21a of the supporting substrate 21: a current from the circuit members 41 is restrained from leaking toward the heat dissipation member(s) 42. For this reason, an electric power loss is not generated and further a faulty operation of the electronic device can be decreased.

In the heat dissipation base 10, it is preferred that the element B is chemically bonded to a metal element in a region near the first main surface 21a of the supporting substrate 21. Since the chemical bonding between the element B and the metal element in the region near the first main surface 21a of the supporting substrate 21 has a high covalent property, the joining strength between the circuit members 41 and the supporting substrate 21 can be made high.

The region near the first main surface 21a of the supporting substrate 21 denotes a region extending from the first main surface 21a of the supporting substrate 21 up to a depth of 5% of the thickness of the supporting substrate 21. For example, when the element B is titanium and the supporting substrate 21 is a ceramic material containing silicon nitride as a main ingredient, examples of the compound having the chemical bonding include $TiSi_x$ wherein x is from 1 to 3 inclusive, and $Ti_5Si_3$. The state that this element B is chemically bonded to the metal element in the region near the first main surface 21a of the supporting substrate 21 can be identified by the X-ray diffraction method.

In the heat dissipation base 10, the content of carbon in the joining layers 31 and 32 is preferably 0.05% by mass or less. When the content of carbon in the joining layers 31 and 32 is 0.05% by mass or less, the content of a carbide, which is easily combined with the element B to turn into a starting point of a crack, is restricted so that the joining layers 31 and 32 are not easily cracked. It is advisable to determine the content of carbon contained in the joining layers 31 and 32 by infrared adsorbing analysis.

The circuit members 41, which constitute the heat dissipation base 10, preferably contain copper, which is a metal high in thermal conductivity, as a main ingredient. The main ingredient referred to herein means an ingredient that occupies 50% by mass or more of all components (100% by mass) constituting the circuit members 41, preferably 80% by mass or more thereof.

The copper, which is the main ingredient of the circuit members 41, is preferably one or more selected from oxygen-free copper, tough pitch copper, and phosphorus deoxidized copper. It is particularly preferred to use, out of species of oxygen-free copper, any one of linear crystalline oxygen-free copper, monocrystalline high-purity oxygen-free copper and vacuum molten copper, which each have a copper content of 99.995% by mass or more. The heat dissipation base 10 on which the circuit members 41 having such a large copper content are set is low in electrical resistance and high in thermal conductivity to be excellent in circuit property (property which restrains heat generated from electronic components thereon to make an electric power loss small) and heat dissipating property. Moreover, the heat dissipation base 10 is low in yield stress to be plastically deformed at high temperature with ease; thus, the circuit members 41 are scarcely peeled from the supporting substrate 21 so that the heat dissipation base 10 exhibits a higher reliability.

In the same manner, the heat dissipation members) 42, which constitute(s) the heat dissipation base 10, preferably contain(s) copper, which is a metal high in thermal conductivity, as a main ingredient. The copper, which is the main ingredient of the heat dissipation members) 42, is preferably one or more selected from oxygen-free copper, tough pitch copper, and phosphorus deoxidized copper. It is particularly preferred to use, out of species of oxygen-free copper, any one of linear crystalline oxygen-free copper, monocrystalline high-purity oxygen-free copper and vacuum molten copper, which each have a copper content of 99.995% by mass or more. The heat dissipation base 10 on which the heat dissipation member 42 having such a copper content of 99.995% by mass or more is formed can be made high in heat dissipating property.

The volume resistivity of each of the circuit members 41 and the heat dissipation member(s) 42 is desirably $5\times10^{-8}$ $\Omega$*m or less, in particular desirably $3\times10^{-8}$ $\Omega$*m or less. The content of each of the elements constituting the circuit members 41 as well as the heat dissipation member(s) 42 can be determined by fluorescent X-ray analysis or ICP atomic emission spectrometry.

The following describes one example of a process for producing the brazing material of the invention.

The brazing material is in a pasty form. Prepared are powders made of silver and copper, respectively, which are to be main components; a powder made of at least one element A selected from indium, zinc, and tin; a powder made of at least one element B selected from titanium, zirconium, hafnium, and niobium; and a powder made of at least one element C selected from molybdenum, osmium, rhenium, and tungsten. The powders are each weighed into a predetermined amount, and then the weighed powders are mixed with each other. Thereto are then added a resin and an organic solvent while the combined components are successively kneaded to defoam the mixture, thereby making it possible to yield the brazing material.

As the resin, for example, acrylic resin, methyl cellulose, ethyl cellulose, nitrocellulose, polyarylate, polymethacrylate or the like may be used. As the organic solvent, for example, alcohol such as terpineol, acetone, toluene, xylene, diethylene glycol monobutyl ether or the like may be used.

Alternatively, the brazing material may be yielded as follows: an inorganic compound flux and an organic solvent are added to mixed powders constituting the brazing material while the combined components are successively kneaded to defoam the mixture. The inorganic compound used for the inorganic compound flux at this time may be, for example, an acid such as boric acid ($H_3BO_3$), or hydroborofluoric acid ($HBF_4$), a chloride such as lithium chloride (LiCl), or magnesium chloride ($MgCl_2$), a fluoride such as sodium fluoride (NaF), a bromide such as potassium bromide (KBr), or potassium tetraborate pentahydrate ($K_2B_4O_7 5H_2O$).

In particular, it is preferable that the contents of the element A, the element B and the element C in the brazing material are not less than 2% by mass and not more than 22% by mass, not less than 1 by mass and not more than 8% by mass, and not less than 1% by mass and not more than 8% by mass, respectively. In order to set these contents into the respective ranges, it is advisable to set the content of the powder made of the element A, that made of the element B and that made of the element C into not less than 2% by mass and not more than 22% by mass, not less than 1 by mass and not more than 8% by mass, and not less than 1% by mass and not more than 8% by mass, respectively, with respect to the powders (100% by mass) constituting the brazing material.

In order to set the copper content in the brazing material into the range of 35 to 50% inclusive by mass, it is advisable to set the content of the powder made of copper into the range of 35 to 50% by mass inclusive of the powders (100% by mass) constituting the brazing material.

In order to set the oxygen content to 2% by mass or less, it is advisable that when the resin and the organic solvent are added to the mixed powders constituting the brazing material while the combined components are successively kneaded to defoam the mixture, the atmosphere is rendered a vacuum.

In order to set the average crystal grain diameter of the element C into the range of 3 µm to 10 µm in the joining layers 31 and 32, it is advisable to use a powder made of the element C and having an average particle size of 3 µm to 10 µm.

The following describes, as one example of the process for producing the heat dissipation base of the invention, the heat dissipation base example illustrated in FIGS. 1(a) to 1(c).

First, a supporting substrate 21 is produced which has a length of 30 mm to 250 mm, a width of 10 mm to 200 mm, and a thickness of 0.13 mm to 0.64 mm and is made of a ceramic material containing silicon nitride or aluminum nitride as a main ingredient. The supporting substrate 21 is thermally treated at a temperature of 800° C. to 900° C. to remove organic substances and remaining carbon which adhere onto any surface of the supporting substrate 21.

Next, the pasty brazing material of the invention is applied onto a first main surface 21a and a second main surface 21b of the thermally treated supporting substrate 21 by screen printing, press printing, brush application or some other method, correspondingly to the arrangement of circuit members 41 and a heat dissipation member 42. The resultant is then dried at a temperature of 120° C. to 150° C.

Copper-containing circuit members 41a and 41b are arranged on the brazing material of the invention that has been applied onto the first main surface 21a of the supporting substrate 21 and then dried, and a heat dissipation member as the heat dissipation member 42 is arranged on the brazing material of the invention that has been applied onto the second main surface 21b and then dried. The resultant is then heated at a temperature ranging from 800 to 900° C. inclusive in a vacuum atmosphere to make it possible to yield a heat dissipation base 10 wherein the circuit members 41a and 41b and the heat dissipation member 42 are joined to the supporting substrate 21 through the joining layers 31a and 31b, and the joining layer 32, respectively, which are each made of the brazing material of the invention. In order to yield the heat dissipation base 10 in which the element B is chemically bonded to a metal element in a region near the first main surface 21a of the supporting substrate 21, it is advisable to set the above-mentioned temperature into the range of 840 to 900° C. inclusive.

In order to yield the heat dissipation base 10 wherein the carbon content in each of the joining layers 31a and 31b, and 32, the content being based on a matter that carbon of a resin, an organic solvent and some other that are added to the brazing material remains, is 0.05% or less by mass, it is advisable to: arrange, for example, the copper-containing circuit members 41a and 41b on the brazing material of the invention that has been applied onto the first main surface 21a of the supporting substrate 21 and then dried; arrange the heat dissipation member 42 onto the brazing material of the invention that has been applied onto the second main surface 21b and then dried; heat the workpiece in a nitrogen atmosphere at a temperature ranging from 350 to 500° C. inclusive; and then heat the workpiece in a vacuum atmosphere at a temperature ranging from 800 to 900° C. inclusive.

About the circuit members 41, it is allowable to: join a copper-containing metal foil piece; print a resist onto the front surface of the joined metal foil piece to give a section arrangement in a matrix form of, for example, 1 row and 2 columns, 2 rows and 4 columns, 3 rows and 2 columns, or 3 rows and 3 columns; dry the resist at a temperature of 120 to 150° C. inclusive; spray nitric sulfuric hydrofluoric acid, nitric hydrofluoric acid, hydrochloric acid, a solution of ferric chloride in water, or some other onto the joint body to remove a region of the metal foil piece that has the front surface on which no resist is printed; and further use an aqueous alkali solution, such as a solution of sodium hydroxide in water or a solution of potassium hydroxide in water, to remove the resist, thereby forming the circuit members 41, which constitute the heat dissipation base 10.

In order to restrain the oxidization of the copper-containing circuit members 41, it is allowable to coat the front surfaces of the circuit members 41 with nickel or gold through palladium. When the heat dissipation member 42 contains copper, it is also allowable to coat the front surface of the heat dissipation member 42 with nickel or gold through palladium.

Alternatively, the oxidization may be restrained by polishing the front surface of each of the circuit members 41 and the heat dissipation member 42 chemically, and then immersing the resultant in an aqueous solution containing at least one of 2-aminopyridine, 2-aminoquinoline, 2-aminopyrimidine, 6-aminopyrimidine, 2-aminopyrazine, 2-aminoquinazoline, 4-aminoquinazoline, 2-aminoquinoxaline, 8-aminopurine, 2-aminobenzoimidazole, aminotriazine and aminotriazole, and substitution derivatives of these compounds.

The brazing material yielded by a producing process as described above is good in wettability to the supporting substrate 21, the circuit members 41, and the heat dissipation member 42, and the element B reacts with nonmetallic components constituting the supporting substrate 21, thereby making it possible to heighten the joining strength between the supporting substrate 21 and the heat dissipation member 42 as well as the circuit members 41. Furthermore, the brazing material contains the element A, which is low in melting point, thereby making it possible to reduce the gaps made between the individual joining layers 31a and 31b, and 32, and the supporting substrate 21, the circuit members 41 or the heat dissipation member 42. Additionally, the brazing material contains the element C, which is high in melting point to restrain the brazing material from becoming too high in viscosity, thereby making it possible to restrain the brazing material from protruding unnecessarily from the joint regions.

In the heat dissipation base 10 produced by a producing process as described above, the copper-containing circuit members 41 are set at the first main surface 21a side of the supporting substrate 21, the heat dissipation member 42 is set at the second main surface 21b side thereof, the second main surface 21b being opposite to the first main surface 21a, and further the circuit members 41 are arranged over the first main surface 21a of the supporting substrate 21, and are each joined onto the supporting substrate through the joining layers 31 made of the brazing material of the invention, thereby making it possible to restrain the brazing material from protruding unnecessarily from the joint regions to reduce a risk that a short circuit is caused between the adjacent circuit members 41a and 41b. Thus, the heat dissipation base 10 can cope with a rise in the integration degree of circuits. Moreover, the gaps generated between the supporting substrate 21 and the circuit members 41 are small, so that the heat dissipation base 10 has a high joining strength therebetween. Thus, the heat dissipation base 10 can be made high in reliability. Furthermore, the use of a copper material having a copper content of 99.995% by mass or more for the circuit members 41, which constitute the heat dissipation base 10, makes the following possible when electronic components are mounted onto the circuit members 41: over a long term, heat generated from the electronic components is effectively dissipated.

In an electronic device in which an electronic component that may be of various types is mounted on the circuit members 41 in the heat dissipation base 10 of the invention, a risk that a short circuit is caused is small so that the device can gain a high reliability; examples of the electronic component include semiconductor elements such as an insulating gate bipolar transistor (IGBT) element, a metal oxide semiconductor field effect transistor (MOSFET) element, a light emitting diode (LED) element; a sublimation-type thermal printer head element; and a thermal ink-jet printer head element.

Hereinafter, working examples of the invention will be specifically described; however, the invention is never limited to these examples.

Example 1

Each pasty brazing material was yielded by weighing each of various powders initially into a predetermined amount to set each of components therein into a content in each of Tables 1 to 3, mixing the powders with each other, adding methylcellulose and terpineol to the mixture while the combined components were successively kneaded to defoam the mixture. When the elements A, B and C in Tables 1 to 3 are each of a single species, the element symbols thereof are shown in columns of A1, B1 and C1, respectively. When the elements A, B and C are each of two species, the element symbol combinations thereof are shown in columns of A1 and A2, ones of B1 and B2, and ones of C1 and C2, respectively.

Next, prepared was a supporting substrate 21 made of a ceramic material containing silicon nitride as a main ingredient and having a length of 60 mm, a width of 30 mm and a thickness of 0.32 mm. The supporting substrate 21 was thermally heated at a temperature of 800 to 900° C. inclusive to remove organic substances and remaining carbon adhering onto any surface of the supporting substrate 21. Thereafter, each of the pasty brazing materials was applied onto regions of first and second main surfaces 21a and 21b of the thermally treated supporting substrate 21, these regions corresponding to the regions where the circuit members 41a and 41b and the heat dissipation member 42 illustrated in FIGS. 2(a) to 2(c) are arranged, by screen printing. Thereafter, the resultant was dried at 135° C. to form the joining layers 31a and 31b, and 32.

Circuit members 41a and 41b made of oxygen-free copper were arranged over the first main surface 21a of the supporting substrate 21, and a heat dissipation member 42 made of oxygen-free copper was arranged over the second main surface 21b opposite to the first main surface 21a to cause the circuit members to contact the joining layers 31a and 31b, and cause the heat dissipation member to contact the joining layer 32. The resultant was then heated at 840° C. in a vacuum atmosphere to yield a heat dissipation base wherein the circuit members 41a and 41b, and the heat dissipation member 42 were joined to the supporting substrate 21 through the joining layers 31a and 31b, and the joining layer 32, respectively.

For reference, the circuit members 41a and 41b may be formed by: joining a metal foil piece made of oxygen-free copper to the first main surface 21a of the supporting substrate 21; printing a resist onto a partial area of the front surface of this metal foil piece in such a manner that the circuit members 41a and 41b would have the form and the arrangement illustrated in FIGS. 2(a) to 2(c); drying the resist at 135° C.; spraying a solution of ferric chloride in water, or some other onto the joint body to remove a front surface region of the metal foil piece where no resist was printed; and further removing the resist with a solution of sodium hydroxide in water.

The circuit members 41a and 41b were each in the form of a square having each side of 24 mm length, and each had a thickness of 0.3 mm. The interval between the circuit members 41a and 41b was set to 2 mm. The heat dissipation member 42 was 58 mm in length and 26 mm in width, and the thickness thereof was set to 0.3 mm. Furthermore, the joining layers 31a and 31b, and the joining layer 32 were made into shapes consistent with the circuit members 41a and 41b, and the heat dissipation member 42, respectively, and the thickness thereof was set to 0.02 mm.

The maximum length of the joining layers 31a and 31b protruding from each side of the circuit members 41a and 41b on a line through which the side of the circuit members 41a and 41b was perpendicularly joined to the side of the supporting substrate 21 was measured with an optical microscope at 50 magnifications. This maximum length was defined as the protrusion length. In the present example, any sample where this protrusion length was more than 0.2 mm was judged to be a case where the brazing material protruded unnecessarily.

Gaps generated between the supporting substrate 21 and the joining layers 31a and 31b were viewed in plan, and the area Sv observed at this time was measured according to an ultrasonic flaw-detecting method. The percentage of the area Sv to the area in the state that no gaps were generated, that is, the total area So of the main surfaces of the supporting substrate 21 that were joined to the circuit members 41a and 41b (=Sv/So×100) was calculated, and the resultant value was defined as the gap ratio. Conditions for the ultrasonic flaw-detecting method were set as follows: a flaw-detecting frequency of 50 MHz, a gain of 30 dB, and a scan pitch of 100 μm.

The peel strength of the circuit member 41a was measured according to JIS C 6481-1996 to evaluate the joining strength between the circuit member 41a and the supporting substrate 21. Before the measurement of the peel strength, the width of the circuit member 41a was made narrow from a width of 24 mm to a width of 10 mm by etching.

By fluorescent X-ray analysis, each element constituting each of the brazing materials was identified and the content thereof was measured. The measured values and calculated values thereof are shown in Tables 1, 2 and 3.

TABLE 1

| Sample No. | Main Component Ag mass % | Main Component Cu mass % | Element A A1 Name of Element | Element A A1 mass % | Element A A2 Name of Element | Element A A2 mass % | Element A A1 + A2 mass % | Element B B1 Name of Element | Element B B1 mass % | Element B B2 Name of Element | Element B B2 mass % |
|---|---|---|---|---|---|---|---|---|---|---|---|
| *1 | 54.5 | 40 | — | 0 | — | — | 0 | Ti | 2.5 | — | — |
| 2 | 53.5 | 40 | In | 1 | — | — | 1 | Ti | 2.5 | — | — |
| 3 | 52.5 | 40 | In | 2 | — | — | 2 | Ti | 2.5 | — | — |
| *4 | 54 | 40 | In | 3 | — | — | 3 | — | 0 | — | — |
| 5 | 53.5 | 40 | In | 3 | — | — | 3 | Ti | 0.5 | — | — |
| 6 | 53 | 40 | In | 3 | — | — | 3 | Ti | 1 | — | — |
| 7 | 51.5 | 40 | In | 3 | — | — | 3 | Ti | 2.5 | — | — |
| *8 | 54.5 | 40 | In | 3 | — | — | 3 | Ti | 2.5 | — | — |
| 9 | 54 | 40 | In | 3 | — | — | 3 | Ti | 2.5 | — | — |
| 10 | 53.5 | 40 | In | 3 | — | — | 3 | Ti | 2.5 | — | — |
| 11 | 57.5 | 34 | In | 3 | — | — | 3 | Ti | 2.5 | — | — |
| 12 | 56.5 | 35 | In | 3 | — | — | 3 | Ti | 2.5 | — | — |
| 13 | 51.5 | 40 | In | 3 | — | — | 3 | Ti | 2.5 | — | — |
| 14 | 41.5 | 50 | In | 3 | — | — | 3 | Ti | 2.5 | — | — |
| 15 | 40.5 | 51 | In | 3 | — | — | 3 | Ti | 2.5 | — | — |
| 16 | 50 | 40 | In | 3 | — | — | 3 | Ti | 2.5 | — | — |
| 17 | 46.5 | 40 | In | 3 | — | — | 3 | Ti | 2.5 | — | — |
| 18 | 45.5 | 40 | In | 3 | — | — | 3 | Ti | 2.5 | — | — |
| 19 | 54 | 40 | In | 3 | — | — | 3 | Ti | 2.5 | — | — |
| 20 | 53.5 | 40 | In | 3 | — | — | 3 | Ti | 2.5 | — | — |
| 21 | 51.5 | 40 | In | 3 | — | — | 3 | Ti | 2.5 | — | — |
| 22 | 50 | 40 | In | 3 | — | — | 3 | Ti | 2.5 | — | — |
| 23 | 46.5 | 40 | In | 3 | — | — | 3 | Ti | 2.5 | — | — |
| 24 | 45.5 | 40 | In | 3 | — | — | 3 | Ti | 2.5 | — | — |
| 25 | 54 | 40 | In | 3 | — | — | 3 | Ti | 2.5 | — | — |
| 26 | 53.5 | 40 | In | 3 | — | — | 3 | Ti | 2.5 | — | — |
| 27 | 51.5 | 40 | In | 3 | — | — | 3 | Ti | 2.5 | — | — |

| Sample No. | Element B B1 + B2 mass % | Element C C1 Name of Element | Element C C1 mass % | Element C C2 Name of Element | Element C C2 mass % | Element C C1 + C2 mass % | Protrusion Length mm | Gap Ratio area % | Peel Strength KN/m |
|---|---|---|---|---|---|---|---|---|---|
| *1 | 2.5 | Mo | 3 | — | — | 3 | 0 | 5 | 26 |
| 2 | 2.5 | Mo | 3 | — | — | 3 | 0 | 1.2 | 30 |
| 3 | 2.5 | Mo | 3 | — | — | 3 | 0 | 0 | 34 |
| *4 | 0 | Mo | 3 | — | — | 3 | 0.5 | 75 | 0.5 |
| 5 | 0.5 | Mo | 3 | — | — | 3 | 0.2 | 4.1 | 10.5 |
| 6 | 1 | Mo | 3 | — | — | 3 | 0.01 | 0.5 | 30 |
| 7 | 2.5 | Mo | 3 | — | — | 3 | 0 | 0 | 35 |
| *8 | 2.5 | — | 0 | — | — | 0 | 0.95 | 0 | 35 |
| 9 | 2.5 | Mo | 0.5 | — | — | 0.5 | 0.2 | 0 | 35 |
| 10 | 2.5 | Mo | 1 | — | — | 1 | 0.02 | 0 | 35 |
| 11 | 2.5 | Mo | 3 | — | — | 3 | 0.01 | 0 | 35 |
| 12 | 2.5 | Mo | 3 | — | — | 3 | 0 | 0 | 39 |
| 13 | 2.5 | Mo | 3 | — | — | 3 | 0 | 0 | 37 |
| 14 | 2.5 | Mo | 3 | — | — | 3 | 0 | 0 | 32 |
| 15 | 2.5 | Mo | 3 | — | — | 3 | 0 | 0 | 30 |
| 16 | 2.5 | Mo | 4.5 | — | — | 4.5 | 0 | 0.2 | 33 |
| 17 | 2.5 | Mo | 8 | — | — | 3 | 0 | 0.6 | 31 |
| 18 | 2.5 | Mo | 9 | — | — | 9 | 0 | 1.1 | 27 |
| 19 | 2.5 | Os | 0.5 | — | — | 0.5 | 0.2 | 0 | 29 |
| 20 | 2.5 | Os | 1 | — | — | 1 | 0.025 | 0 | 35 |
| 21 | 2.5 | Os | 3 | — | — | 3 | 0.01 | 0 | 35 |
| 22 | 2.5 | Os | 4.5 | — | — | 4.5 | 0 | 0.2 | 33 |
| 23 | 2.5 | Os | 8 | — | — | 8 | 0 | 0.5 | 32 |
| 24 | 2.5 | Os | 9 | — | — | 9 | 0 | 1.1 | 26 |
| 25 | 2.5 | Re | 0.5 | — | — | 0.5 | 0.2 | 0 | 34 |
| 26 | 2.5 | Re | 1 | — | — | 1 | 0.03 | 0 | 34 |
| 27 | 2.5 | Re | 3 | — | — | 3 | 0.015 | 0 | 35 |

* means a sample of Comparative Example.

TABLE 2

| | Main Component | | Element A | | | | Element B | | | |
| | | | A1 | | A2 | | B1 | | B2 | |
| Sample No. | Ag mass % | Cu mass % | Name of Element | A1 mass % | Name of Element | A2 mass % | A1 + A2 mass % | Name of Element | B1 mass % | Name of Element | B2 mass % |
|---|---|---|---|---|---|---|---|---|---|---|---|
| 28 | 50 | 40 | In | 3 | — | — | 3 | Ti | 2.5 | — | — |
| 29 | 46.5 | 40 | In | 3 | — | — | 3 | Ti | 2.5 | — | — |
| 30 | 45.5 | 40 | In | 3 | — | — | 3 | Ti | 2.5 | — | — |
| 31 | 54 | 40 | In | 3 | — | — | 3 | Ti | 2.5 | — | — |
| 32 | 53.5 | 40 | In | 3 | — | — | 3 | Ti | 2.5 | — | — |
| 33 | 51.5 | 40 | In | 3 | — | — | 3 | Ti | 2.5 | — | — |
| 34 | 50 | 40 | In | 3 | — | — | 3 | Ti | 2.5 | — | — |
| 35 | 46.5 | 40 | In | 3 | — | — | 3 | Ti | 2.5 | — | — |
| 36 | 45.5 | 40 | In | 3 | — | — | 3 | Ti | 2.5 | — | — |
| 37 | 54 | 40 | In | 3 | — | — | 3 | Ti | 2.5 | — | — |
| 38 | 53.5 | 40 | In | 3 | — | — | 3 | Ti | 2.5 | — | — |
| 39 | 51.5 | 40 | In | 3 | — | — | 3 | Ti | 2.5 | — | — |
| 40 | 50 | 40 | In | 3 | — | — | 3 | Ti | 2.5 | — | — |
| 41 | 46.5 | 40 | In | 3 | — | — | 3 | Ti | 2.5 | — | — |
| 42 | 45.5 | 40 | In | 3 | — | — | 3 | Ti | 2.5 | — | — |
| 43 | 47.5 | 40 | In | 3 | — | — | 3 | Ti | 6.5 | — | — |
| 44 | 46 | 40 | In | 3 | — | — | 3 | Ti | 8 | — | — |
| 45 | 45 | 40 | In | 3 | — | — | 3 | Ti | 9 | — | — |
| 46 | 53.5 | 40 | In | 3 | — | — | 3 | Zr | 0.5 | — | — |
| 47 | 53 | 40 | In | 3 | — | — | 3 | Zr | 1 | — | — |
| 48 | 51.5 | 40 | In | 3 | — | — | 3 | Zr | 2.5 | — | — |
| 49 | 47.5 | 40 | In | 3 | — | — | 3 | Zr | 6.5 | — | — |
| 50 | 46 | 40 | In | 3 | — | — | 3 | Zr | 8 | — | — |
| 51 | 45 | 40 | In | 3 | — | — | 3 | Zr | 9 | — | — |
| 52 | 53.5 | 40 | In | 3 | — | — | 3 | Hf | 0.5 | — | — |
| 53 | 53 | 40 | In | 3 | — | — | 3 | Hf | 1 | — | — |
| 54 | 51.5 | 40 | In | 3 | — | — | 3 | Hf | 2.5 | — | — |
| 55 | 47.5 | 40 | In | 3 | — | — | 3 | Hf | 6.5 | — | — |
| 56 | 46 | 40 | In | 3 | — | — | 3 | Hf | 8 | — | — |
| 57 | 45 | 40 | In | 3 | — | — | 3 | Hf | 9 | — | — |
| 58 | 53.5 | 40 | In | 3 | — | — | 3 | Nb | 0.5 | — | — |
| 59 | 53 | 40 | In | 3 | — | — | 3 | Nb | 1 | — | — |
| 60 | 51.5 | 40 | In | 3 | — | — | 3 | Nb | 2.5 | — | — |

| | | Element C | | | | | | |
| | Element B | C1 | | C2 | | | Protusion | | Peel |
| Sample No. | B1 + B2 mass % | Name of Element | C1 mass % | Name of Element | C2 mass % | C1 + C2 mass % | Length mm | Gap Ratio area % | Strength KN/m |
|---|---|---|---|---|---|---|---|---|---|
| 28 | 2.5 | Re | 4.5 | — | — | 4.5 | 0 | 0.2 | 34 |
| 29 | 2.5 | Re | 8 | — | — | 8 | 0 | 0.5 | 30 |
| 30 | 2.5 | Re | 9 | — | — | 9 | 0 | 1 | 24 |
| 31 | 2.5 | W | 0.5 | — | — | 0.5 | 0.2 | 0 | 35 |
| 32 | 2.5 | W | 1 | — | — | 1 | 0.03 | 0 | 34 |
| 33 | 2.5 | W | 3 | — | — | 3 | 0.015 | 0 | 34 |
| 34 | 2.5 | W | 4.5 | — | — | 4.5 | 0 | 0.3 | 31 |
| 35 | 2.5 | W | 8 | — | — | 8 | 0 | 0.6 | 29 |
| 36 | 2.5 | W | 9 | — | — | 9 | 0 | 1.1 | 25 |
| 37 | 2.5 | Mo | 0.25 | W | 0.25 | 0.5 | 0.2 | 0 | 36 |
| 38 | 2.5 | Mo | 0.5 | W | 0.5 | 1 | 0 | 0 | 36 |
| 39 | 2.5 | Mo | 1.5 | W | 1.5 | 3 | 0 | 0 | 36 |
| 40 | 2.5 | Mo | 2.25 | W | 2.25 | 4.5 | 0 | 0.3 | 35 |
| 41 | 2.5 | Mo | 4 | W | 4 | 8 | 0 | 0.6 | 32 |
| 42 | 2.5 | Mo | 4.5 | W | 4.5 | 9 | 0 | 1.2 | 29 |
| 43 | 6.5 | Mo | 3 | — | — | 3 | 0 | 0 | 34 |
| 44 | 8 | Mo | 3 | — | — | 3 | 0 | 0.2 | 30 |
| 45 | 9 | Mo | 3 | — | — | 3 | 0 | 0.9 | 24 |
| 46 | 0.5 | Mo | 3 | — | — | 3 | 0.015 | 4.1 | 10.5 |
| 47 | 1 | Mo | 3 | — | — | 3 | 0.005 | 0.5 | 30 |
| 48 | 2.5 | Mo | 3 | — | — | 3 | 0 | 0 | 35 |
| 49 | 6.5 | Mo | 3 | — | — | 3 | 0 | 0 | 34 |
| 50 | 8 | Mo | 3 | — | — | 3 | 0 | 0.2 | 30 |
| 51 | 9 | Mo | 3 | — | — | 3 | 0.2 | 0.9 | 24 |
| 52 | 0.5 | Mo | 3 | — | — | 3 | 0.2 | 4.2 | 9.1 |
| 53 | 1 | Mo | 3 | — | — | 3 | 0.01 | 1.5 | 29 |
| 54 | 2.5 | Mo | 3 | — | — | 3 | 0 | 0 | 34 |
| 55 | 6.5 | Mo | 3 | — | — | 3 | 0 | 0 | 34 |
| 56 | 8 | Mo | 3 | — | — | 3 | 0 | 0.1 | 29 |
| 57 | 9 | Mo | 3 | — | — | 3 | 0 | 1.2 | 24 |
| 58 | 0.5 | Mo | 3 | — | — | 3 | 0.2 | 4.1 | 9 |

TABLE 2-continued

| Sample No. | Element B B1 + B2 mass % | C1 Name of Element | C1 mass % | C2 Name of Element | C2 mass % | C1 + C2 mass % | Protrusion Length mm | Gap Ratio area % | Peel Strength KN/m |
|---|---|---|---|---|---|---|---|---|---|
| 59 | 1 | Mo | 3 | — | — | 3 | 0.015 | 1.8 | 27 |
| 60 | 2.5 | Mo | 3 | — | — | 3 | 0 | 0 | 34 |

TABLE 3

| | Main Component | | Element A | | | | | Element B | | | |
|---|---|---|---|---|---|---|---|---|---|---|---|
| | | | A1 | | A2 | | | B1 | | B2 | |
| Sample No. | Ag mass % | Cu mass % | Name of Element | A1 mass % | Name of Element | A2 mass % | A1 + A2 mass % | Name of Element | B1 mass % | Name of Element | B2 mass % |
| 61 | 47.5 | 40 | In | 3 | — | — | 3 | Nb | 6.5 | — | — |
| 62 | 46 | 40 | In | 3 | — | — | 3 | Nb | 8 | — | — |
| 63 | 45 | 40 | In | 3 | — | — | 3 | Nb | 9 | — | — |
| 64 | 53.5 | 40 | In | 3 | — | — | 3 | Ti | 0.25 | Zr | 0.25 |
| 65 | 53 | 40 | In | 3 | — | — | 3 | Ti | 0.5 | Zr | 0.5 |
| 66 | 51.5 | 40 | In | 3 | — | — | 3 | Ti | 1.25 | Zr | 1.25 |
| 67 | 47.5 | 40 | In | 3 | — | — | 3 | Ti | 3.25 | Zr | 3.25 |
| 68 | 46 | 40 | In | 3 | — | — | 3 | Ti | 4 | Zr | 4 |
| 69 | 45 | 40 | In | 3 | — | — | 3 | Ti | 4.5 | Zr | 4.5 |
| 70 | 42.5 | 40 | In | 12 | — | — | 12 | Ti | 2.5 | — | — |
| 71 | 32.5 | 40 | In | 22 | — | — | 22 | Ti | 2.5 | — | — |
| 72 | 30.5 | 40 | In | 24 | — | — | 24 | Ti | 2.5 | — | — |
| 73 | 53.5 | 40 | Zn | 1 | — | — | 1 | Ti | 2.5 | — | — |
| 74 | 52.5 | 40 | Zn | 2 | — | — | 2 | Ti | 2.5 | — | — |
| 75 | 42.5 | 40 | Zn | 12 | — | — | 12 | Ti | 2.5 | — | — |
| 76 | 32.5 | 40 | Zn | 22 | — | — | 22 | Ti | 2.5 | — | — |
| 77 | 30.5 | 40 | Zn | 24 | — | — | 24 | Ti | 2.5 | — | — |
| 78 | 53.5 | 40 | Sn | 1 | — | — | 1 | Ti | 2.5 | — | — |
| 79 | 52.5 | 40 | Sn | 2 | — | — | 2 | Ti | 2.5 | — | — |
| 80 | 42.5 | 40 | Sn | 12 | — | — | 12 | Ti | 2.5 | — | — |
| 81 | 32.5 | 40 | Sn | 22 | — | — | 22 | Ti | 2.5 | — | — |
| 82 | 30.5 | 40 | Sn | 24 | — | — | 24 | Ti | 2.5 | — | — |
| 83 | 53.5 | 40 | In | 0.5 | Zn | 0.5 | 1 | Ti | 2.5 | — | — |
| 84 | 52.5 | 40 | In | 1 | Zn | 1 | 2 | Ti | 2.5 | — | — |
| 85 | 42.5 | 40 | In | 6 | Zn | 6 | 12 | Ti | 2.5 | — | — |
| 86 | 32.5 | 40 | In | 11 | Zn | 11 | 22 | Ti | 2.5 | — | — |
| 87 | 30.5 | 40 | In | 12 | Zn | 12 | 24 | Ti | 2.5 | — | — |
| 88 | 53.5 | 40 | In | 0.5 | Sn | 0.5 | 1 | Ti | 2.5 | — | — |
| 89 | 52.5 | 40 | In | 1 | Sn | 1 | 2 | Ti | 2.5 | — | — |
| 90 | 42.5 | 40 | In | 6 | Sn | 6 | 12 | Ti | 2.5 | — | — |
| 91 | 32.5 | 40 | In | 11 | Sn | 11 | 22 | Ti | 2.5 | — | — |
| 92 | 30.5 | 40 | In | 12 | Sn | 12 | 24 | Ti | 2.5 | — | — |

| Sample No. | Element B B1 + B2 mass % | C1 Name of Element | C1 mass % | C2 Name of Element | C2 mass % | C1 + C2 mass % | Protrusion Length mm | Gap Ratio area % | Peel Strength KN/m |
|---|---|---|---|---|---|---|---|---|---|
| 61 | 6.5 | Mo | 3 | — | — | 3 | 0 | 0 | 34 |
| 62 | 8 | Mo | 3 | — | — | 3 | 0 | 0.1 | 30 |
| 63 | 9 | Mo | 3 | — | — | 3 | 0 | 0.5 | 39 |
| 64 | 0.5 | Mo | 3 | — | — | 3 | 0.2 | 3.5 | 13.5 |
| 65 | 1 | Mo | 3 | — | — | 3 | 0.01 | 0.1 | 34 |
| 66 | 2.5 | Mo | 3 | — | — | 3 | 0 | 0 | 37 |
| 67 | 6.5 | Mo | 3 | — | — | 3 | 0 | 0 | 36 |
| 68 | 8 | Mo | 3 | — | — | 3 | 0 | 0.2 | 31 |
| 69 | 9 | Mo | 3 | — | — | 3 | 0 | 0.7 | 29 |
| 70 | 2.5 | Mo | 3 | — | — | 3 | 0.05 | 0 | 35 |
| 71 | 2.5 | Mo | 3 | — | — | 3 | 0.1 | 0 | 35 |
| 72 | 2.5 | Mo | 3 | — | — | 3 | 0.2 | 0 | 35 |
| 73 | 2.5 | Mo | 3 | — | — | 3 | 0 | 2 | 28 |
| 74 | 2.5 | Mo | 3 | — | — | 3 | 0 | 0 | 33 |
| 75 | 2.5 | Mo | 3 | — | — | 3 | 0.005 | 0 | 33 |
| 76 | 2.5 | Mo | 3 | — | — | 3 | 0.14 | 0 | 33 |
| 77 | 2.5 | Mo | 3 | — | — | 3 | 0.15 | 0 | 34 |
| 78 | 2.5 | Mo | 3 | — | — | 3 | 0 | 2.5 | 27 |
| 79 | 2.5 | Mo | 3 | — | — | 3 | 0 | 0 | 34 |
| 80 | 2.5 | Mo | 3 | — | — | 3 | 0 | 0 | 35 |
| 81 | 2.5 | Mo | 3 | — | — | 3 | 0.14 | 0 | 34 |
| 82 | 2.5 | Mo | 3 | — | — | 3 | 0.15 | 0 | 33 |
| 83 | 2.5 | Mo | 3 | — | — | 3 | 0 | 2 | 28 |
| 84 | 2.5 | Mo | 3 | — | — | 3 | 0 | 0 | 33 |
| 85 | 2.5 | Mo | 3 | — | — | 3 | 0 | 0 | 33 |
| 86 | 2.5 | Mo | 3 | — | — | 3 | 0.19 | 0 | 33 |

TABLE 3-continued

| | | | | | | | | | |
|---|---|---|---|---|---|---|---|---|---|
| 87 | 2.5 | Mo | 3 | — | — | 3 | 0.2 | 0 | 34 |
| 88 | 2.5 | Mo | 3 | — | — | 3 | 0 | 2.5 | 27 |
| 89 | 2.5 | Mo | 3 | — | — | 3 | 0 | 0 | 34 |
| 90 | 2.5 | Mo | 3 | — | — | 3 | 0 | 0 | 35 |
| 91 | 2.5 | Mo | 3 | — | — | 3 | 0.19 | 0 | 34 |
| 92 | 2.5 | Mo | 3 | — | — | 3 | 0.2 | 0 | 33 |

As shown in Tables 1 to 3, it is understood that in sample No. 1, which is a comparative example, no element A was contained, and thus the fluidity of the brazing material was bad so that the gap ratio between the supporting substrate 21 and the joining layers 31 was high and many gaps were present. It is understood that in sample No. 4, which is a comparative example, no element B was contained, and thus the value of the peel strength of the circuit member 41a was small so that the joining strength between the circuit member 41a and the supporting substrate 21 was low. It is understood that in sample No. 8, which is a comparative example, no element C was contained, and thus the protrusion length was as long as 1.5 mm so that the brazing material protruded unnecessarily.

By contrast, it is understood that in each of sample Nos. 2, 3, 5 to 7, and 9 to 92, the circuit members 41 and 41b were joined to the supporting substrate 21 through the joining layers 31a and 31b, respectively, which were made of the brazing material containing silver and copper as main components, and containing at least one element A selected from indium, zinc, and tin, at least one element B selected from titanium, zirconium, hafnium, and niobium, and at least one element C selected from molybdenum, osmium, rhenium, and tungsten, and thus only a few gaps were generated so that a high joining strength was obtained, and further it is understood that an unnecessary protrusion over an protrusion length of 0.2 mm was not caused so that the heat dissipation base was a base about which a risk that a short circuit was caused was small.

Comparisons between sample Nos. 9 to 18, wherein the elements A, B and C were indium, titanium and molybdenum, respectively, and the contents of the element A, as well as those of the element B, were equal to each other, and the contents of the element C were different from each other, demonstrate that in sample Nos. 10 to 17, the contents of the element B were from 1 to 8% inclusive by mass, and thus the joining layers 31a and 31b did not protrude so that gaps between the supporting substrate 21 and the joining layers 31 were small.

Comparisons between sample Nos. 5 to 7, and 43 to 45, wherein the elements A, B and C were indium, titanium and molybdenum, respectively, and the contents of the element A, as well as those of the element C, were equal to each other, and the contents of the element B were different from each other, demonstrate that in sample Nos. 6, 7, 43 and 44, the contents of the element B were from 1 to 8% inclusive by mass, and thus the peel strength was 30 KN/m or more so that the joining strength between the circuit member 41a and the supporting substrate 21 was high.

Comparisons between sample Nos. 2, 3, 7, 12 to 15, 76, and 77, wherein the elements A, B and C were indium, titanium and molybdenum, respectively, and the contents of the element B, as well as those of the element C, were equal to each other, and the contents of the element A were different from each other, demonstrate that in sample Nos. 3, 7, 12 to 15, 70 and 71, the contents of the element A were from 2 to 22% inclusive by mass, and thus the protrusion length was short, and the gap ratio between the supporting substrate 21 and the joining layers 31 was zero so that the joining strength was high.

Comparisons between sample Nos. 11 to 15, wherein the elements A, as well as the elements B and C, were equivalent to each other in species and content, demonstrate that in sample Nos. 12, 13 and 14, the copper contents were from 35 to 50% inclusive by mass, and thus no gaps were present and further the joining strength was sufficiently kept so that no protrusion was caused.

Example 2

Each pasty brazing material was yielded by: weighing each of various powders initially and mixing the powders in such a manner that the contents of silver and copper are 51.5% by mass and 40% by mass, respectively, and the content of tin as the element A, that of titanium as the element B, and that of molybdenum as the element C are 3% by mass, 2.5% by mass, and 3% by mass, respectively; and adding methylcellulose and terpineol thereto while the combined components were successively kneaded in any one out of atmospheres shown in Table 4 to defoam the mixture. When the atmosphere was a vacuum atmosphere, the ultimate vacuum thereof is shown in Table 4. The oxygen content in each of the resultant brazing materials was measured by infrared absorbing analysis, and the resultant value is shown in Table 4.

Next, prepared was a supporting substrate 21 made of a ceramic material containing silicon nitride as a main ingredient and having a length of 60 mm, a width of 30 mm, and a thickness of 0.32 mm, and then the same manner as described in Example 1 was used to yield each heat dissipation base.

In the same manner as in Example 1, the peel strength of the circuit member 41a (each of the bases) was measured according to JIS C 6481-1996. The resultant values are shown in Table 4.

TABLE 4

| Sample No. | Atmosphere | Ultimate Vaccum Pa | Oxygen mass % | Peel Strength KN/m |
|---|---|---|---|---|
| 93 | Air | — | 4 | 32 |
| 94 | Vaccum | 100 | 2 | 35 |
| 95 | Vaccum | 50 | 1 | 36 |

As shown in Table 4, it is understood that in sample Nos. 94 and 95, wherein the brazing material having an oxygen content of 2% by mass or less was used, the peel strength was higher than in sample No. 93, wherein the brazing material having an oxygen content over 2% by mass was used, so that these samples gained a high joining strength.

Example 3

Each pasty brazing material was yielded by: weighing each of various powders initially and mixing the powders in such a manner that the content of silver and that of copper would be 51.5% by mass and 40% by mass, respectively, and the content of tin as the element A, that of titanium as the element B, and that of molybdenum as the element C would be 3% by mass, 2.5% by mass, and 3% by mass, respectively; and adding methylcellulose and terpineol thereto while the combined components were successively kneaded to defoam the mixture. The used molybdenum powder was a powder having any one out of average particle diameters shown in Table 5.

Next, prepared was a supporting substrate 21 made of a ceramic material containing silicon nitride as a main ingredient and having a length of 60 mm, a width of 30 mm, and a thickness of 0.32 mm, and then each heat dissipation base was yielded in the same manner as described in Example 1 except that the temperature for heating and joining the circuit members 41a and 41b and the heat dissipation member 42 to the supporting substrate 21 was changed from 840 to 900° C.

In the same manner as in Example 1, the protrusion length, the gap ratio, and the peel strength were determined, and the resultant values are each shown in Table 5.

About the average crystal grain diameter of the element C in the joining layers 31, the joining layers 31 were immersed for one minute in a solution of 40° C. temperature wherein hydrogen peroxide water and diluted sulfuric acid were mixed with each other at 50% by mass, so as to etch the layers, and then an electron probe micro analysis was used to identify the element C. The average crystal grain diameter thereof was measured according to a cutting method described in JIS H 0501-1986 (ISO 2624-1973).

TABLE 5

| Sample No. | Average Grain Diameter μm | Average Crystal Grain Diameter μm | Protrusion Length mm | Gap Ratio area % | Peel Strength KN/m |
|---|---|---|---|---|---|
| 96 | 2 | 2 | 0.2 | 0 | 35 |
| 97 | 3 | 3 | 0.1 | 0.1 | 35 |
| 98 | 5 | 5 | 0.05 | 0.3 | 33 |
| 99 | 8 | 8 | 0.05 | 0.3 | 33 |
| 100 | 10 | 10 | 0 | 0.6 | 30 |
| 101 | 11 | 11 | 0 | 1.2 | 28 |

As shown in Table 5, it is understood that in sample Nos. 97 to 100, wherein the average crystal grain diameter of the element C in the joining layers 31 was from 3 to 10 μm inclusive, the brazing material was restrained from protruding unnecessarily from the joint regions, and further gaps generated between the supporting substrate 21 and the circuit members 41 were sufficiently restrained, so that a high joining strength was gained.

Example 4

Heat dissipation bases were each produced by preparing a supporting substrate 21 made of any one of ceramic materials containing aluminum nitride and silicon nitride, respectively, and then joining circuit members 41 and a heat dissipation member 42 that were each made of any one of oxygen-free copper and SUS304 to the substrate 21 through joining layers 31 and 32 made of the same brazing material as in Example 2. A simulation was then made in which a calorie of 40 W/m² was regarded as being given to each unit area of the main surfaces of the circuit members 41 of each of the heat dissipation bases having the above-mentioned respective materials and structures. In this way, the thermal resistance of the heat dissipation base was estimated. The estimated value is shown in Table 6.

TABLE 6

| Sample No. | Material of Supporting Substrate | Material of Circuit Member and Heat Dissipation Member | Estimated Value of Thermal Resistance ° C./W |
|---|---|---|---|
| 102 | Aluminium Oxide | Oxygen-free Copper | 0.31 |
| 103 | Aluminium Oxide | SUS304 | 0.5 |
| 104 | Silicon Nitride | Oxygen-free Copper | 0.26 |
| 105 | Silicon Nitride | SUS304 | 0.41 |
| 106 | Aluminium Nitride | Oxygen-free Copper | 0.2 |
| 107 | Aluminium Nitride | SUS304 | 0.34 |

As shown in Table 6, in sample Nos. 102, 104 and 106, wherein the circuit members 41 and the heat dissipation member 42 were made of oxygen-free copper, the thermal resistance values as results of the simulation were smaller than in sample Nos. 103, 105 and 107, wherein the circuit members 41 and the heat dissipation member 42 were made of SUS304, when samples using the respective supporting substrates 21 made of the same material were compared with each other. The result demonstrates that copper is higher in thermal conductivity than iron to make the heat dissipating property higher.

Example 5

A pasty brazing material was yielded by: weighing each of various powders initially and mixing the powders in such a manner that the content of silver and that of copper would be 51.5% by mass and 40% by mass, respectively, and the content of tin as the element A, that of titanium as the element B, and that of molybdenum as the element C would be 3% by mass, 2.5% by mass, and 3% by mass, respectively; and adding methylcellulose and terpineol thereto while the combined components were successively kneaded to defoam the mixture. This brazing material was used to yield each heat dissipation base in the same way as in Example 1 except that the thermally treating temperature for the joining was set to any one out of temperatures shown in Table 7.

An X-ray diffraction method was used to make an identification, thereby checking the state that titanium was chemically bonded to silicon in a region near the first main surface of the supporting substrate 21. Of these samples, any sample wherein titanium silicide was able to be identified is represented by ○, and any sample wherein titanium silicide was unable to be identified is represented by Δ in Table 7. The peel strength of the circuit member 41a was measured according to JIS C 6481-1996 in the same way as in Example 1, and the resultant value is shown in Table 7.

TABLE 7

| Sample No. | Thermally Treating Temperature for Joining ° C. | Titanium Silicide | Peel Strength KN/m |
|---|---|---|---|
| 108 | 840 | ○ | 35 |
| 109 | 900 | ○ | 32 |
| 110 | 800 | Δ | 23 |

As shown in Table 7, in sample Nos. 108 and 109, wherein titanium silicide was identified, the peel strength was higher than in sample No. 110, wherein titanium silicide was not identified. It is therefore understood that when thermal treatment is conducted at a temperature of 840 to 900° C. inclusive in the joining, silicon near the first main surface 21a of the supporting substrate 21 containing silicon nitride as a main ingredient is chemically bonded to titanium as the element B so that the joining strength is made high because of a high covalent property of the bonding between titanium and silicon.

Example 6

A pasty brazing material was yielded by: weighing each of various powders initially and mixing the powders in such a manner that the content of silver and that of copper would be 51.5% by mass and 40% by mass, respectively, and the content of tin as the element A, that of titanium as the element B, and that of molybdenum as the element C would be 3% by mass, 2.5% by mass, and 3% by mass, respectively; and adding methylcellulose and terpineol thereto while the combined components were successively kneaded to defoam the mixture.

Next, prepared were supporting substrates 21 each made of a ceramic material containing silicon nitride as a main ingredient and each having a length of 60 mm, a width of 30 mm and a thickness of 0.32 mm. Each of the supporting substrates 21 was thermally heated at a temperature of 800 to 900° C. inclusive to remove organic substances and remaining carbon adhering onto any surface of the supporting substrate 21. Thereafter, the pasty brazing material was applied onto regions of first and second main surfaces 21a and 21b of the thermally treated supporting substrate 21, these regions corresponding to the regions where the circuit members 41a and 41b and the heat dissipation member 42 illustrated in FIGS. 2(a) to 2(c) are arranged, by screen printing. Thereafter, the resultant was dried at 135° C. to form the joining layers 31a and 31b, and 32.

Circuit members 41a and 41b made of oxygen-free copper were arranged over the first main surface 21a of each of the supporting substrates 21, and a heat dissipation member 42 made of oxygen-free copper was arranged over the second main surface 21b opposite to the first main surface 21a to cause the circuit members to contact the joining layers 31a and 31b, and cause the heat dissipation member to contact the joining layer 32.

The resultant workpieces were each then heated at any one out of temperatures shown in Table 8 in a nitrogen atmosphere, and then heated at 850° C. in a vacuum atmosphere to yield heat dissipation bases in each of which the circuit members 41a and 41b, and the heat dissipation member 42 were joined to the supporting substrate 21 through the joining layers 31a and 31b, and 32, respectively.

The content of carbon contained in the joining layers 31a and 31b, and 32 was determined by infrared absorbing analysis. Additionally, a heat cycle test was made about the heat dissipation base. Whenever the base underwent 100 cycles after 3000 cycles, an optical microscope was used to check whether or not the joining layers 31a and 31b, and 32 were cracked at 500 magnifications. Any one of the cycles was rendered a cycle wherein the environmental temperature was lowered from room temperature to −45° C., kept at the temperature for 15 minutes, raised up to 125° C., kept at the temperature for 15 minutes, and then lowered to room temperature. The number of the cycle wherein it was observed that any one of the joining layers 31a and 31b, and 32 was cracked is shown in Table 8.

TABLE 8

| Sample No. | Carbon mass % | Temperature ° C. | Cycle |
|---|---|---|---|
| 111 | 0.07 | 200 | 3100 |
| 112 | 0.05 | 350 | 3300 |
| 113 | 0.03 | 500 | 3400 |

As shown in Table 8, it is understood that in sample Nos. 112 and 113, wherein the carbon content in each of the joining layers 31a and 31b, and 32 was 0.05% or less by mass, the joining layers 31a and 31b, and 32 were not easily cracked since the content of a carbide, which is easily combined with titanium as the element B to turn easily into a crack-starting point, was restricted.

Additionally, electronic components were mounted onto circuit members of each of such excellent heat dissipation bases of the invention. As a result, electronic devices high in reliability were able to be produced, about which a risk that a short circuit was caused was small.

EXPLANATION OF REFERENCE NUMERALS

10: heat dissipation base
21: supporting substrate
31, 32: joining layers
41: circuit members
42: heat dissipation member(s)

The invention claimed is:

1. A heat dissipation base comprising:
a supporting substrate containing ceramic material;
a plurality of circuit members containing copper and formed on a first main surface of the supporting substrate; and
a heat dissipation member formed on a second main surface of the supporting substrate, the second main surface being opposite to the first main surface, wherein
the plurality of the circuit members are arranged on the first main surface of the supporting substrate, and each of the plurality of circuit members and the heat dissipation member is joined to the supporting substrate through a joining layer composed of a brazing material,
wherein the brazing material comprises silver and copper as main components; at least one element A selected from indium, zinc and tin; at least one element B selected from titanium, zirconium, hafnium and niobium; and at least one element C selected from molybdenum, osmium, rhenium and tungsten,
wherein a content of copper is not less than 35% by mass and not more than 50% by mass, based on the total amount of silver, copper, and the elements A, B and C, and
wherein a content of carbon is 0.05% by mass or less.

2. The heat dissipation base according to claim 1, wherein the content of oxygen in the brazing material is 2% by mass or less.

3. The heat dissipation base according to claim 1, wherein contents of the element A, the element B, and the element C are not less than 2% by mass and not more than 22% by mass, not less than 1% by mass and not more than 8% by mass, and not less than 1% by mass and not more than 8% by mass, respectively, based on the total amount of silver, copper, and the elements A, B and C.

4. The heat dissipation base according to claim 1, wherein the element C in the joining layer has an average crystal grain diameter of not less than 3 μm and not more than 10 μm.

5. The heat dissipation base according to claim 1, wherein the supporting substrate contains a ceramic material containing silicon nitride or aluminum nitride as a main component.

6. The heat dissipation base according to claim 1, wherein the element B is chemically bonded to a metal element in a region near the first main surface of the supporting substrate.

7. An electronic device comprising:
   the heat dissipation base according to claim 1; and
   an electronic component mounted on the circuit members of the heat dissipation base.

* * * * *